(12) United States Patent
Henmi et al.

(10) Patent No.: US 7,323,753 B2
(45) Date of Patent: Jan. 29, 2008

(54) MOS TRANSISTOR CIRCUIT AND VOLTAGE-BOOSTING BOOSTER CIRCUIT

(75) Inventors: Kazuo Henmi, Gunma (JP); Nobuyuki Otaka, Kadoma (JP)

(73) Assignee: Sanyo Electric Co. Ltd., Osaka (JP)

( * ) Notice: Subject to any disclaimer, the term of this patent is extended or adjusted under 35 U.S.C. 154(b) by 158 days.

(21) Appl. No.: 10/924,507

(22) Filed: Aug. 24, 2004

(65) Prior Publication Data

US 2005/0045964 A1 Mar. 3, 2005

(30) Foreign Application Priority Data

Aug. 26, 2003 (JP) ............... 2003-301499

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/379; 257/342; 257/345; 257/349; 257/350; 257/355; 257/356; 257/358; 257/360; 257/363; 257/368; 257/371; 257/372; 257/382

(58) Field of Classification Search ............ 257/342, 257/345, 349–350, 355–356, 358, 360, 363, 257/368, 371, 372, 382, 379
See application file for complete search history.

(56) References Cited

U.S. PATENT DOCUMENTS

| 4,647,956 | A | * | 3/1987 | Shrivastava et al. | ........ 257/373 |
| 5,270,565 | A | * | 12/1993 | Lee et al. | ........... 257/358 |
| 5,311,048 | A | * | 5/1994 | Takahashi et al. | .......... 257/207 |
| 5,338,986 | A | * | 8/1994 | Kurimoto | ............... 327/566 |
| 5,477,413 | A | * | 12/1995 | Watt | .................. 361/56 |
| 5,581,103 | A | * | 12/1996 | Mizukami | ............. 257/355 |
| 5,594,611 | A | * | 1/1997 | Consiglio et al. | .......... 361/118 |
| 6,043,540 | A | * | 3/2000 | Matsui et al. | ............. 257/368 |
| 6,299,185 | B1 | * | 10/2001 | Chen | ..................... 257/372 |
| 6,437,407 | B1 | * | 8/2002 | Ker et al. | ................ 257/357 |
| 6,501,137 | B1 | * | 12/2002 | Yu et al. | .................. 257/355 |
| 6,621,108 | B2 | * | 9/2003 | Tashiro et al. | ............. 257/173 |
| 6,740,934 | B2 | * | 5/2004 | Lee et al. | ................ 257/355 |
| 6,756,642 | B2 | * | 6/2004 | Lee et al. | ................ 257/355 |

(Continued)

FOREIGN PATENT DOCUMENTS

JP 7-298607 11/1995

OTHER PUBLICATIONS

English Patent Abstract for 7-298607 from esp@cenet, published Nov. 10, 1995.

*Primary Examiner*—Ida M. Soward
(74) *Attorney, Agent, or Firm*—Osha Liang L.L.P.

(57) ABSTRACT

To an output of an NMOS having one end connected to a power source, a capacitor and a PMOS are connected. A capacitor is connected to the output of the PMOS. The NMOS and the PMOS are turned on alternately. A pulse is applied to other end of the capacitor which is connected to the output of the NMOS, to shift the output of the NMOS for boosting. Then, a back gate of the NMOS is connected, via a PMOS in an on state, to the power source. With this structure, the PMOS provides a resistor component when the output terminal short-circuits.

4 Claims, 5 Drawing Sheets

U.S. PATENT DOCUMENTS

| | | | |
|---|---|---|---|
| 6,833,590 B2* | 12/2004 | Makita et al. | 257/355 |
| 6,864,543 B2* | 3/2005 | Kaneko et al. | 257/371 |
| 6,867,637 B2* | 3/2005 | Miyazaki et al. | 327/534 |
| 6,917,095 B1* | 7/2005 | Wong et al. | 257/548 |
| 6,982,406 B2* | 1/2006 | Chen | 250/214.1 |
| 7,012,307 B2* | 3/2006 | Lin et al. | 257/360 |
| 2002/0031882 A1* | 3/2002 | Uchida | 438/228 |
| 2002/0105021 A1* | 8/2002 | Myono et al. | 257/299 |
| 2003/0112056 A1* | 6/2003 | Tanzawa et al. | 327/536 |
| 2003/0143964 A1* | 7/2003 | Otsuka et al. | 455/127 |
| 2004/0251484 A1* | 12/2004 | Miyazaki et al. | 257/299 |
| 2005/0063112 A1* | 3/2005 | Negishi et al. | 361/56 |
| 2005/0281119 A1* | 12/2005 | Shibata et al. | 365/230.06 |
| 2006/0071653 A1* | 4/2006 | Gattiker et al. | 324/76.11 |

* cited by examiner

MOS TRANSISTOR CIRCUIT AND VOLTAGE-BOOSTING BOOSTER CIRCUIT

CROSS-REFERENCE TO RELATED APPLICATION(S)

The entire disclosure of Japanese Patent Application No. 2003-301499 including specification, claims, drawings and abstract is incorporated herein by reference in its entirety.

BACKGROUND OF THE INVENTION

1. Field of the Invention

The present invention relates to suppression of large currents in a transistor circuit which uses an MOS transistor.

2. Description of Related Art

In circuits which operate using a battery as a power source, reduction of voltage in the power source has been conventionally demanded, and circuits which operate using a battery power source of 3V or 1.5V are becoming common. On the other hand, there are circuits in which high voltage is required, and a charge pump circuit (a booster circuit) and a level shift circuit are therefore often used to generate high voltage by means of a battery power source.

Such a booster circuit is described in, for example, Japanese Patent Laid-Open Publication No. Hei 7-298607.

However, such conventional booster circuits suffer from a problem in that, when a short circuit occurs at the output side, a large current will flow through the circuit. The inventors of the present application studied this problem and recognized that such large currents, which the refer to as a "high current" flows from a power source via a parasitic diode formed in a transistor which is used in a booster circuit.

Voltage boosting using a CMOS which is shown in FIG. 1 can provide an example. Referring to FIG. 1, a power source voltage VDD on the input side is connected with a source of an NMOS 10. A drain of the NMOS 10 is connected with one end of a shifting capacitor 12, to which a pulse voltage is supplied from the other end. The drain of the NMOS 10 is also connected to a drain of a PMOS 14, and a source of the PMOS 14 is connected with a voltage holding capacitor 16 and also with an output terminal 18.

An identical clock signal is supplied to gates of the NMOS 10 and the PMOS 14.

In the circuit thus configured, when a clock signal is high (H), the NMOS 10 turns on and the PMOS 14 turns off, and voltage VDD is held in the shifting capacitor 12. On the other hand, when a clock signal is low (L), the NMOS 10 turns off and the PMOS 14 turns on. In this state, by applying a pulse signal for voltage shifting to shift the voltage of the shifting capacitor 12 by an amount of voltage VDD, for example, voltage of 2VDD is held in the holding capacitor 16 and is output.

FIG. 2 shows a structure of an NMOS. As shown, a pair of N regions are formed within a P well to provide a source S and a drain D, and a gate electrode G is formed via an insulating film in the channel region between the source S and the drain D. Further, a P++ region is also formed within the P well to provide a back gate BG. With this structure, a parasitic diode due to P-N junction is formed from the back gate BG toward the source S and the drain D.

FIG. 3 shows a structure of a PMOS. As shown, a pair of P regions are formed within an N well to provide a source S and a drain D, and a gate electrode G is formed via a gate insulating film in the channel region between the source S and the drain D. Further, an N++ region is also formed within the N well to provide a back gate BG. With this structure, a parasitic diode due to P-N junction is formed from the source S and the drain D toward the back gate BG.

Further, FIG. 4 shows an NMOS having a triple-well structure in which the above-described P well is contained within an N well. In this structure, a parasitic diode from the back gate BG to the N well is further added.

FIG. 5 shows the route of current when the NMOS having a triple-well structure of FIG. 4 and the PMOS shown in FIG. 3 are applied to the booster circuit of FIG. 1 and short circuit is caused in the output.

In this booster circuit, with regard to both MOS's, the source S and the back gate BG are short-circuited in their normal use, and the output terminal 18 is connected with the N well so as to provide a high potential.

In a booster circuit, the output side is normally at a high voltage, and in such a case, a parasitic diode would not create a problem. When the output is short-circuited to ground, however, short-circuit current flows from the power source via the parasitic diode. Specifically, an example short-circuit route would be power source VDD→source S of NMOS→back gate BG→N well→output terminal 18, which is defined as a route (i). Another short-circuit route would be power source VDD→source S of NMOS→back gate BG of NMOS→drain of NMOS→drain of PMOS→back gate BG of PMOS→source of PMOS→output terminal 18, which is defined as a route (ii).

In particular, with regard to the route (i) which is a short-circuit route with only one diode, high current flows and this significantly affects the circuit. The route (ii), on the other hand, passes through two diodes and therefore affects less significantly than the route (i). However, some measures should also be taken to account for the route (ii).

SUMMARY OF THE INVENTION

In an NMOS transistor, a parasitic diode is formed from the P well toward the N region. Further, normally, a source and the P well are commonly connected to a power source at the input side. Consequently, although no problem results when the output side is at high potential, current flows from the power source at the input side via the parasitic diode when the output side is short-circuited to ground. According to the present invention, short-circuit current can be reduced by providing a PMOS resistor in an on state or a normal resistor element between the power source and the N well.

Further, in an NMOS having a triple-structure in which an N well is contained in a P well, a parasitic diode is formed from the P well toward the N well. In such a case, because the N well is connected to the circuit output, current flows from the power source at the input side to the N well, the parasitic diode, and the P well sequentially in this order when the output side is short-circuited. According to the present invention, short-circuit current can be reduced by providing a PMOS resistor in an on state or a normal resistor element between the power source and the N well, or between the N well and the circuit output.

In particular, the circuit of the present invention is especially preferable for a booster circuit, because a booster circuit premises that the output side becomes high voltage and suffers from the above problems when the output is short-circuited.

BRIEF DESCRIPTION OF THE DRAWINGS

A preferred embodiment of the present invention will be described in further detail based on the following drawing, wherein.

DETAILED DESCRIPTION OF PREFERRED EMBODIMENTS

Preferred embodiments of the present invention will be described in detail with reference to the accompanying drawings.

Figure 1:
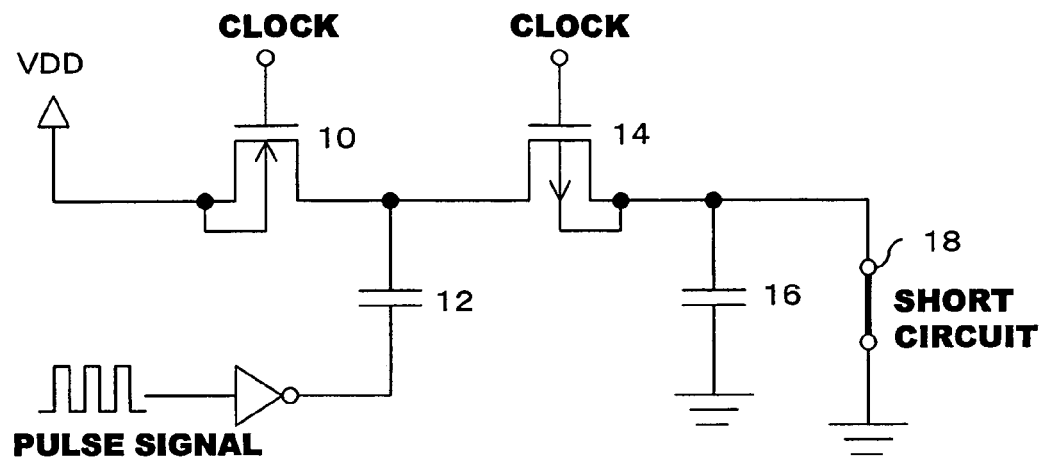
FIG. 1 is a view showing a structure of a booster circuit.
Figure 6:
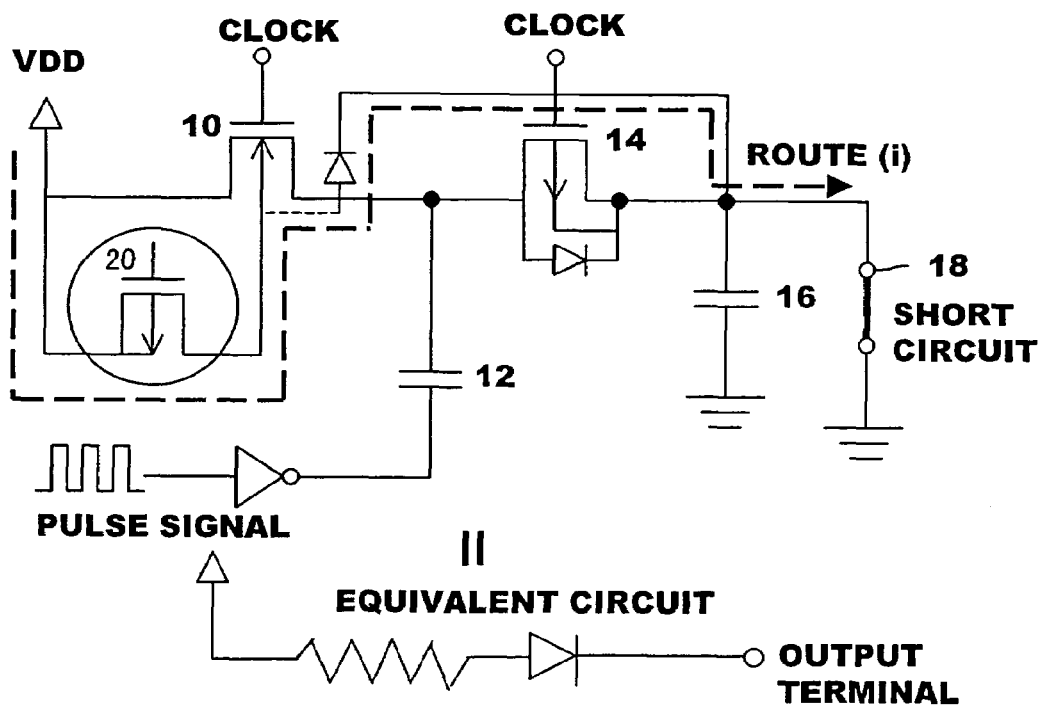
FIG. 6 is a view showing a structure of an embodiment of the present invention.

FIG. 6 is a view showing a structure of a first embodiment of the present invention. FIG. 6 shows a booster circuit which employs a CMOS similar to that in FIG. 1, in which power source voltage VDD on the input side is connected with a source of an NMOS 10. A drain of the NMOS 10 is connected with one end of a shifting capacitor 12, to which pulse voltage is applied from the other end. The drain of the NMOS 10 is also connected to a drain of a PMOS 14, and a source of the PMOS 14 is connected with a voltage holding capacitor 16 and also with an output terminal 18. An identical pulse (clock) signal is supplied to gates of the NMOS 10 and the PMOS 14.

In the circuit thus configured, by turning the NMOS 10 on and turning the PMOS 14 off using a clock signal, voltage VDD is held in the shifting capacitor 12. Further, in a state where the NMOS 10 is turned off while the PMOS 14 turns on, by applying a pulse signal for voltage shifting to shift the voltage of the shifting capacitor 12 by an amount of voltage VDD, for example, voltage of 2VDD is held in the holding capacitor 16 for output.

In the present embodiment, a short-circuit is not created between the source S and the back gate BG of the NMOS 10, and the back gate BG is connected to the power source VDD via a resistor PMOS 20. The PMOS 20, whose gate is fixed to an L state, is in an on state and operates as an electrical resistor element. More specifically, as shown in an equivalent circuit shown in FIG. 6, the on-state resistor PMOS 202 is disposed between the power source VDD and the parasitic diode.

Accordingly, as shown in FIG. 6, when the output terminal 18 is short-circuited to ground, short-circuit current flows not only via the diode provided between the back gate BG of the NMOS 10 and the N well, but also via the PMOS 20 which serves as a resistor component. As a result, the short-circuit current can be significantly reduced.

Figure 7:
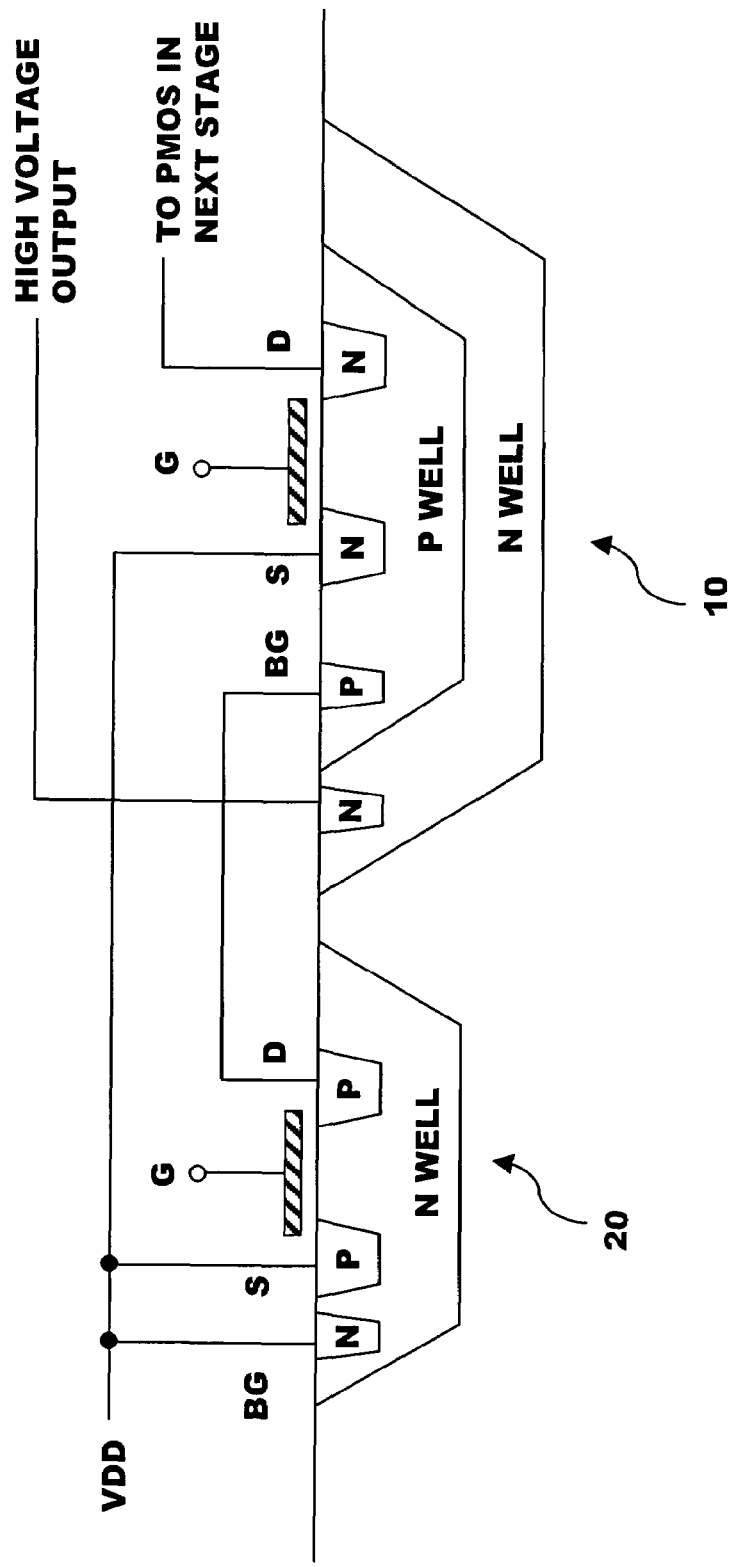
FIG. 7 is a view showing a detailed structure of FIG. 6.

FIG. 7 is a schematic view showing structures of the NMOS 10 and the PMOS 20. As shown, the back gate BG of the NMOS 10 is connected to the power source VDD via the PMOS 20. The PMOS 20 can be formed by the same process as used for other CMOS.

Figure 8:
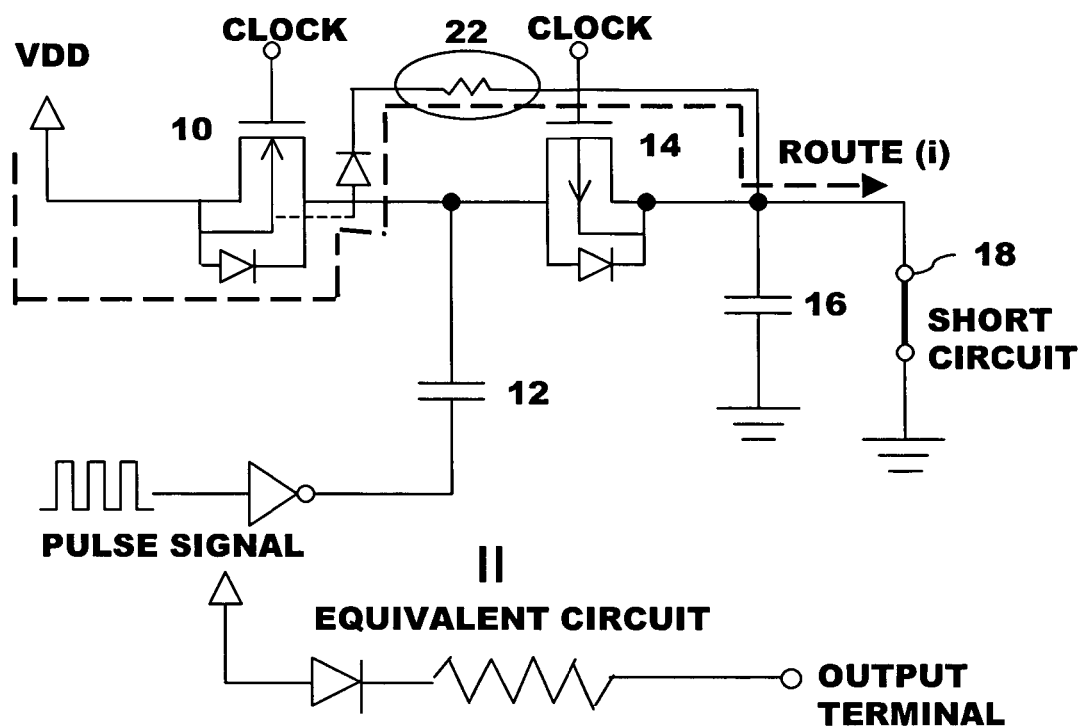
FIG. 8 is a view showing another embodiment of the present invention.

FIG. 8 shows an example structure of another embodiment of the present invention. In this example, a resistor element 22 is disposed between the N well of the NMOS 10 and the output terminal 18. With this structure, the resistor element 22 is located after the parasitic resistor of NMOS 10, so that the amount of current flowing from the N well to the output terminal 18 can be reduced. The resistor element 22 may be a diffused resistor or a wire resistor, and a resistor of approximately 100 kΩ may be preferably used when the power source voltage is 3V.

The resistor element 22 can be used in place of the PMOS 20 in the example shown in FIG. 6. Alternatively, the on-state resistor PMOS 20 can be used in place of the resistor element 22, as in the example shown in FIG. 8.

Figure 2:
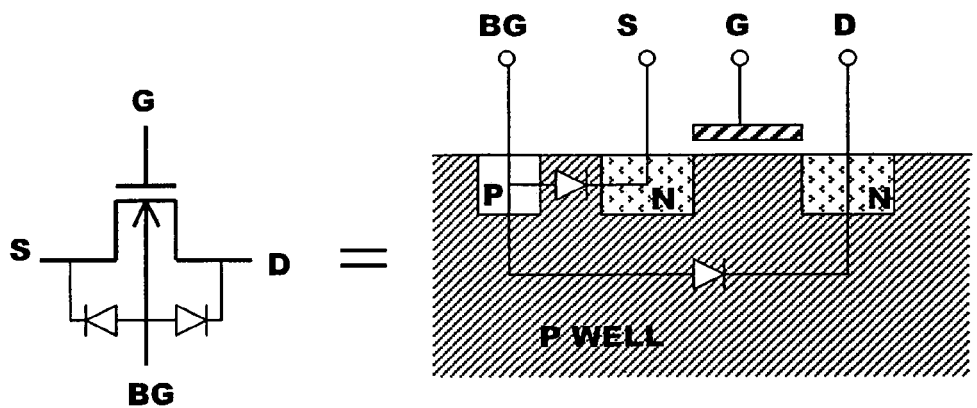
FIG. 2 is a view showing a structure of an NMOS.
Figure 3:
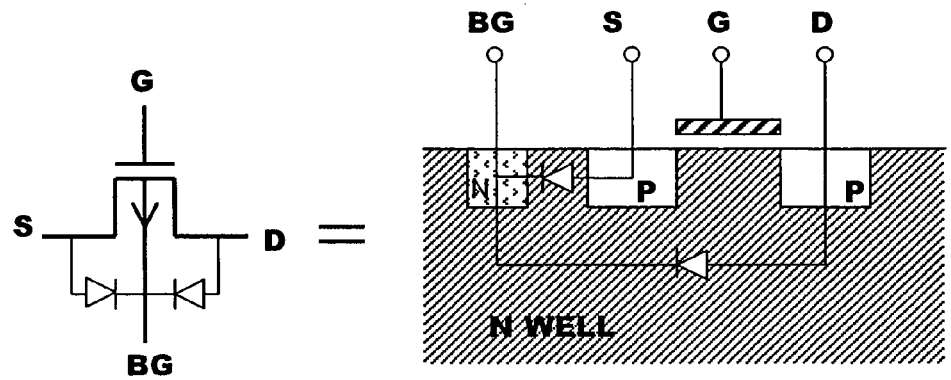
FIG. 3 is a view showing a structure of a PMOS.
Figure 4:
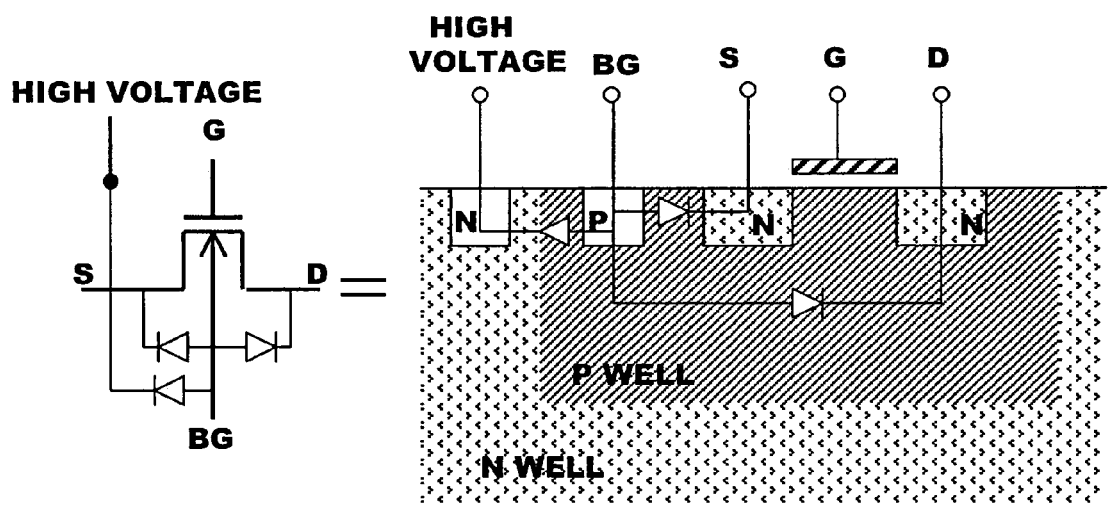
FIG. 4 is a view showing a structure of a triple-well NMOS.
Figure 5:
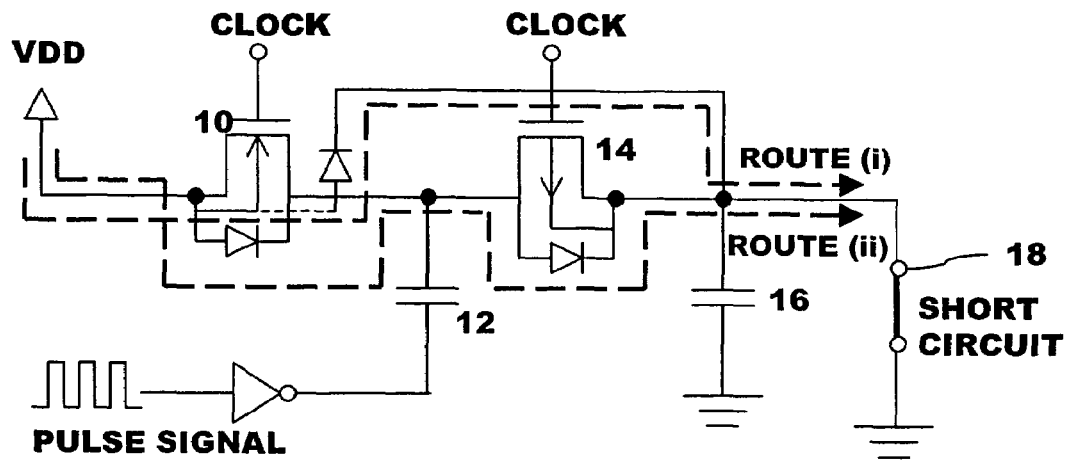
FIG. 5 is a view showing a current route when an output terminal is short-circuited in a booster circuit.

Further, while an NMOS having a triple-well structure is used in the example of FIG. 5, the NMOS is not limited to such a structure. More specifically, when an NMOS having the structure shown in FIG. 2 is used in the example of FIG. 5, due to the absence of N well, one parasitic diode is eliminated and the route (i) is therefore eliminated. However, because disposition of the PMOS 20 (or a resistor element) provides a resistor for the route (ii), high current at the time of short-circuit of the output can be reduced.

While high current at the time of short-circuit of output can be reduced with the structure of the present embodiment, short-circuit current cannot be terminated. It is therefore preferable that the voltage of the output terminal 18 is monitored to detect a short circuit by detecting that the voltage is not boosted in spite of the operation of the booster circuit, and that such measures as separating the output terminal are taken when short-circuit is detected. Further, various known methods can be appropriately adopted as necessary, in order to detect high current.

While preferred embodiments of the present invention have been described using specific terms, such description is for illustrative purposes only, and it is to be understood that changes and variations may be made without departing from the spirit or scope of the appended claims.

What is claimed is:

1. A transistor circuit comprising:
   an NMOS transistor formed by forming a pair of N regions within a P well to provide a source region connected to a source electrode and a drain region connected to a drain electrode and forming a gate electrode opposed to a channel region between the source region and the drain region via an insulating film,
   wherein the source electrode is connected to a power source and the P well is connected to the power source via an electrical resistor element,
   wherein the electrical resistor element is a PMOS in an on state.

2. A transistor circuit comprising:
   an NMOS transistor formed by forming a P well within an N well, forming a pair of N regions within the P well to provide a source region connected to a source electrode and a drain region connected to a drain electrode, and forming a gate electrode opposed to a channel region between the source region and the drain region via an insulating film,
   wherein the N well is connected to a circuit output via an electrical resistor element.

3. A transistor circuit according to claim 2, wherein the electrical resistor element is a PMOS in an on state.

4. A transistor circuit according to claim 2, wherein the electrical resistor element is a resistor element.

* * * * *